(12) United States Patent
Ma et al.

(10) Patent No.: US 12,525,161 B2
(45) Date of Patent: Jan. 13, 2026

(54) NARROW BORDER REFLECTIVE DISPLAY DEVICE

(71) Applicant: E Ink Holdings Inc., Hsinchu (TW)

(72) Inventors: Chen-Yun Ma, Hsinchu (TW); Chin Tsung Liang, Hsinchu (TW); Sheng-Long Lin, Hsinchu (TW)

(73) Assignee: E Ink Holdings Inc., Hsinchu (TW)

(*) Notice: Subject to any disclaimer, the term of this patent is extended or adjusted under 35 U.S.C. 154(b) by 0 days.

(21) Appl. No.: 18/185,360

(22) Filed: Mar. 16, 2023

(65) Prior Publication Data
US 2023/0351934 A1 Nov. 2, 2023

(30) Foreign Application Priority Data

Apr. 28, 2022 (TW) .................................. 111116159
Oct. 24, 2022 (TW) .................................. 111140171

(51) Int. Cl.
*G09G 3/00* (2006.01)
*G09G 3/20* (2006.01)
(Continued)

(52) U.S. Cl.
CPC ............... *G09G 3/035* (2020.08); *G09G 3/20* (2013.01); *H01L 24/05* (2013.01); *H01L 24/06* (2013.01);
(Continued)

(58) Field of Classification Search
CPC .. G09G 3/035; G09G 3/20; G09G 2300/0426; H01L 24/05; H01L 24/06;
(Continued)

(56) References Cited

U.S. PATENT DOCUMENTS 8,772,780 B2 * 7/2014 Huang ................ H01L 27/1259
257/E21.409
8,873,015 B2 10/2014 Seki et al.
(Continued)

FOREIGN PATENT DOCUMENTS

CN 103676366 A * 3/2014 ......... G02F 1/13306
CN 104698636 A 6/2015
(Continued)

OTHER PUBLICATIONS

The office action of the corresponding TW application No. 111116159 issued on Apr. 10, 2023.
(Continued)

*Primary Examiner* — Ricardo Osorio
(74) *Attorney, Agent, or Firm* — CKC & Partners Co., LLC

(57) ABSTRACT

A narrow border reflective display device includes an driving circuit substrate, a TFT substrate, a front plane laminate, multiple conductive wires, a cover, and a glue. The TFT substrate is located on the driving circuit substrate. The TFT substrate is located between the driving circuit substrate and the front plane laminate. The conductive wires are electrically connected with the driving circuit substrate and the TFT substrate. The cover is located on the front plane laminate. The glue surrounds the driving circuit substrate, the TFT substrate, the front plane laminate, the front plane laminate, and the conductive wires.

15 Claims, 9 Drawing Sheets

(51) Int. Cl.
*H01L 23/00* (2006.01)
*H01L 25/065* (2023.01)
*H10D 86/40* (2025.01)
*H10D 86/60* (2025.01)

(52) U.S. Cl.
CPC .......... *H01L 24/48* (2013.01); *H01L 25/0657* (2013.01); *H10D 86/411* (2025.01); *H10D 86/441* (2025.01); *H10D 86/60* (2025.01); *G09G 2300/0426* (2013.01); *H01L 2224/05573* (2013.01); *H01L 2224/06145* (2013.01); *H01L 2224/48145* (2013.01); *H01L 2225/06506* (2013.01)

(58) Field of Classification Search
CPC . H01L 24/08; H01L 25/0657; H01L 27/1218; H01L 27/124; H01L 2224/05573; H01L 2224/06145; H01L 2224/48145; H01L 2224/06506
See application file for complete search history.

(56) References Cited

U.S. PATENT DOCUMENTS

| | | | |
|---|---|---|---|
| 9,275,574 B2 | 3/2016 | Hur et al. | |
| 9,454,025 B2 | 9/2016 | Zhong et al. | |
| 10,034,369 B2* | 7/2018 | Park | G09G 3/3611 |
| 10,079,069 B2* | 9/2018 | Jin | G06F 3/04164 |
| 10,229,964 B2 | 3/2019 | Kim et al. | |
| 10,451,942 B2 | 10/2019 | Yu et al. | |
| 10,481,729 B2* | 11/2019 | Park | G06F 3/0445 |
| 10,497,772 B2 | 12/2019 | Lhee et al. | |
| 10,831,073 B1 | 11/2020 | Wu | |
| 10,877,332 B2 | 12/2020 | Drzaic et al. | |
| 11,060,922 B2 | 7/2021 | Altenbeck et al. | |
| 11,107,416 B2* | 8/2021 | Cho | H10K 59/1216 |
| 11,150,706 B2 | 10/2021 | Horiuchi et al. | |
| 11,221,718 B2* | 1/2022 | Choi | G06F 3/0445 |
| 11,415,843 B2* | 8/2022 | Ye | G02F 1/13454 |
| 2003/0134460 A1 | 7/2003 | Forbes et al. | |
| 2007/0164948 A1* | 7/2007 | Kim | G09G 3/3611 345/87 |
| 2009/0325342 A1 | 12/2009 | Takiar et al. | |
| 2009/0325344 A1 | 12/2009 | Takiar et al. | |
| 2010/0134743 A1* | 6/2010 | Shin | H01L 27/124 349/150 |
| 2011/0115765 A1* | 5/2011 | Chang | G02F 1/1339 345/206 |
| 2012/0313905 A1* | 12/2012 | Kang | G02F 1/1345 445/24 |
| 2013/0207134 A1* | 8/2013 | Shin | G09G 3/20 257/88 |
| 2014/0078705 A1 | 3/2014 | Jo | |
| 2014/0240933 A1* | 8/2014 | Lee | G06F 1/1656 29/831 |
| 2015/0279918 A1 | 10/2015 | Teraguchi et al. | |
| 2016/0219723 A1* | 7/2016 | Jung | H05K 1/147 |
| 2016/0291382 A1 | 10/2016 | Chai | |
| 2016/0300853 A1* | 10/2016 | Yamazaki | G09G 3/035 |
| 2017/0219895 A1 | 8/2017 | Yu et al. | |
| 2017/0309644 A1* | 10/2017 | Yeh | H01L 27/124 |
| 2018/0090091 A1* | 3/2018 | Sim | G09G 3/3233 |
| 2018/0095309 A1* | 4/2018 | Yu | G02F 1/167 |
| 2018/0108677 A1* | 4/2018 | Yeh | H01L 27/1262 |
| 2018/0267353 A1 | 9/2018 | Takeda et al. | |
| 2019/0204651 A1* | 7/2019 | Bai | G02F 1/13452 |
| 2020/0203465 A1 | 6/2020 | Kim et al. | |
| 2020/0279820 A1* | 9/2020 | Lu | H01L 25/18 |
| 2020/0379523 A1 | 12/2020 | Horiuchi et al. | |
| 2020/0402967 A1 | 12/2020 | Yoshida | |
| 2021/0089158 A1* | 3/2021 | Kang | G06F 3/0443 |
| 2021/0110782 A1* | 4/2021 | Hur | G09G 3/3677 |
| 2021/0132429 A1* | 5/2021 | Jang | G02F 1/13336 |
| 2021/0225879 A1 | 7/2021 | Asai et al. | |
| 2021/0298210 A1* | 9/2021 | Huang | H05K 5/0021 |
| 2023/0299091 A1* | 9/2023 | Lan | H01L 24/05 257/89 |
| 2023/0306886 A1* | 9/2023 | Xiong | G09G 3/20 |
| 2023/0352452 A1* | 11/2023 | Tsai | G09G 3/035 |

FOREIGN PATENT DOCUMENTS

| | | | | |
|---|---|---|---|---|
| CN | 107561799 A | * | 1/2018 | ........ G02F 1/13452 |
| CN | 107886893 A | | 4/2018 | |
| CN | 108389538 A | * | 8/2018 | ............... G09G 3/20 |
| CN | 109712558 A | * | 5/2019 | |
| CN | 209674154 U | * | 11/2019 | ........ G01R 31/2825 |
| CN | 111566551 A | | 8/2020 | |
| CN | 111952321 A | * | 11/2020 | ........ H01L 27/1214 |
| CN | 112652275 A | * | 4/2021 | ........... G09G 3/3406 |
| CN | 112840475 A | | 5/2021 | |
| CN | 113129799 A | * | 7/2021 | ........... G09G 3/2074 |
| KR | 100942554 B1 | | 2/2010 | ............. H10K 59/87 |
| KR | 20110016794 A | * | 2/2011 | |
| KR | 101940187 B1 | * | 1/2019 | ............... G09F 9/00 |
| KR | 20200072782 A | * | 6/2020 | |
| KR | 20230132642 A | | 9/2023 | |
| TW | 201826477 A | | 7/2018 | |
| TW | M575190 U | | 3/2019 | |
| TW | 201928624 A | | 7/2019 | |
| TW | 202109480 A | | 3/2021 | |
| TW | 202121036 A | | 6/2021 | |
| TW | 202131522 A | | 8/2021 | |
| TW | 202137862 A | | 10/2021 | |
| WO | WO-2021184915 A1 | * | 9/2021 | ....... G02F 1/136286 |

OTHER PUBLICATIONS

The office action of related U.S. Appl. No. 18/297,003 issued on Dec. 7, 2023.
The office action of corresponding TW application No. 111140171 issued on Sep. 28, 2023.
The office action of related TW application No. 112139459 issued on Jan. 31, 2024.
The office action of related U.S. Appl. No. 18/297,003 issued on Apr. 3, 2024.
The office action of CN application No. 202210506575.5 issued on Jul. 2, 2025.

* cited by examiner

NARROW BORDER REFLECTIVE DISPLAY DEVICE

RELATED APPLICATIONS

This application claims priority to Taiwan Application Serial Number 111116159, filed Apr. 28, 2022, and Taiwan Application Serial Number 111140171, filed Oct. 24, 2022, which are herein incorporated by reference in their entireties.

BACKGROUND

Field of Invention

The present disclosure relates to a narrow border reflective display device.

Description of Related Art

The driving method of the display device in the related art needs to electrically connect the flexible printed circuit (FPC) board and the driver integrated circuit (IC) with the thin film transistor (TFT) substrate by using a chip on film process. However, both the bending area of the flexible printed circuit board and the bonding pads for bonding the flexible printed circuit board make it difficult to shrink the size of the border area of the display device. In addition, the appearance requirements of wearable display devices are versatile, and the above manufacturing method is difficult to meet the requirement of display devices with arbitrary shapes.

For the foregoing reason, there is a need to solve the above-mentioned problem by providing a display device, which is also a subject that the present field is eager to research and develop.

SUMMARY

One aspect of the present disclosure provides a narrow border reflective display device.

One aspect of the present disclosure is a narrow border reflective display device. The narrow border reflective display device includes a driving circuit substrate, a TFT substrate, a front panel laminate, a plurality of conductive wires, a cover, and a glue. The TFT substrate is located on the driving circuit substrate. The TFT substrate is located between the driving circuit substrate and the front panel laminate. The conductive wires are electrically connected with the driving circuit substrate and the TFT substrate. The cover is located on the front panel laminate. The glue surrounds the driving circuit substrate, the TFT substrate, the front panel laminate, and the conductive wires.

In one embodiment of the present disclosure, the cover has a first surface facing the driving circuit substrate, and a vertical projection of the driving circuit substrate onto the first surface is located within a range of the first surface.

In one embodiment of the present disclosure, the TFT substrate includes a display area and a peripheral area surrounding the display area. The TFT substrate has a boundary between the display area and the peripheral area. The cover has an edge. In a top view, a distance from a vertical projection of the boundary of the TFT substrate onto the cover to the edge of the cover is smaller than 2.5 mm.

In one embodiment of the present disclosure, the driving circuit substrate further includes a plurality of first conductive pads, the TFT substrate further includes a plurality of second conductive pads, and the conductive wires are electrically connected with the first conductive pads and the second conductive pads, respectively.

In one embodiment of the present disclosure, the driving circuit substrate has a second surface facing the TFT substrate, the first conductive pads are located on the second surface, and the first conductive pads surround the TFT substrate.

In one embodiment of the present disclosure, the TFT substrate has a third surface facing the front panel laminate, the second conductive pads are located on the third surface, and the second conductive pads surround the front panel laminate.

In one embodiment of the present disclosure, the TFT substrate includes a protective layer, a polyimide film, and an adhesive layer located between the protective layer and the polyimide film.

In one embodiment of the present disclosure, a material of the TFT substrate includes glass.

In one embodiment of the present disclosure, the driving circuit substrate includes a protective layer, a polyimide film, and an adhesive layer located between the protective layer and the polyimide film.

In one embodiment of the present disclosure, a material of the driving circuit substrate includes glass.

In one embodiment of the present disclosure, the driving circuit substrate has a second surface facing the TFT substrate, the narrow border reflective display device further includes a flexible printed circuit board and a chip. The flexible printed circuit board is bonded to the second surface of the driving circuit substrate, and the chip is bonded to the flexible printed circuit board.

In one embodiment of the present disclosure, the cover has a first surface facing the driving circuit substrate, and in a top view a vertical projection of the flexible printed circuit board and the chip onto the first surface of the cover is located within a range of the first surface.

In one embodiment of the present disclosure, the driving circuit substrate has a fourth surface facing away from the TFT substrate. The driving circuit substrate is a printed circuit board or a flexible printed circuit board, and the narrow border reflective display device further includes a chip bonded to the fourth surface of the driving circuit substrate.

In one embodiment of the present disclosure, the glue surrounds and covers a side surface of the driving circuit substrate.

Another aspect of the present disclosure is a narrow border reflective display device.

In one embodiment of the present disclosure, the narrow border reflective display device includes a driving circuit substrate, a TFT substrate, a front panel laminate, a plurality of conductive wires, a cover, and a glue. The TFT substrate is located on the driving circuit substrate. The TFT substrate is located between the driving circuit substrate and the front panel laminate. The conductive wires are electrically connected with the driving circuit substrate and the TFT substrate. The cover is located on the front panel laminate. The glue is located between the cover and the driving circuit substrate and between the cover and the TFT substrate. The driving circuit substrate, the TFT substrate, the front panel laminate, the conductive wires, and the glue entirely overlap the cover in a vertical direction.

In one embodiment of the present disclosure, the glue surrounds and covers a side surface of the driving circuit substrate.

In one embodiment of the present disclosure, the cover has a first surface facing the driving circuit substrate, and a vertical projection of the driving circuit substrate onto the first surface is located within a range of the first surface.

In one embodiment of the present disclosure, the TFT substrate includes a display area and a peripheral area surrounding the display area. The TFT substrate has a boundary between the display area and the peripheral area. The cover has an edge. In a top view, a distance from a vertical projection of the boundary of the TFT substrate onto the cover to the edge of the cover is smaller than 2.5 mm.

According to the above embodiments, by stacking the TFT substrate and the driving circuit substrate and by using the conductive wires to electrically connect the first conductive pads and the second conductive pads distributed in the border area, the flexible printed circuit board does not need to be bonded to the TFT substrate. In other words, merely a distance between the first conductive pad and the second conductive pad is needed for consideration when determining the width of the border area. As a result, the width of the border area of the narrow border reflective display device can be shrunk. Additionally, the shape of the border area can be determined depending on the shape of the display area, so that the narrow border reflective display device can have a customized shape.

It is to be understood that both the foregoing general description and the following detailed description are by examples, and are intended to provide further explanation of the disclosure as claimed.

DESCRIPTION OF THE EMBODIMENTS

Figure 1:
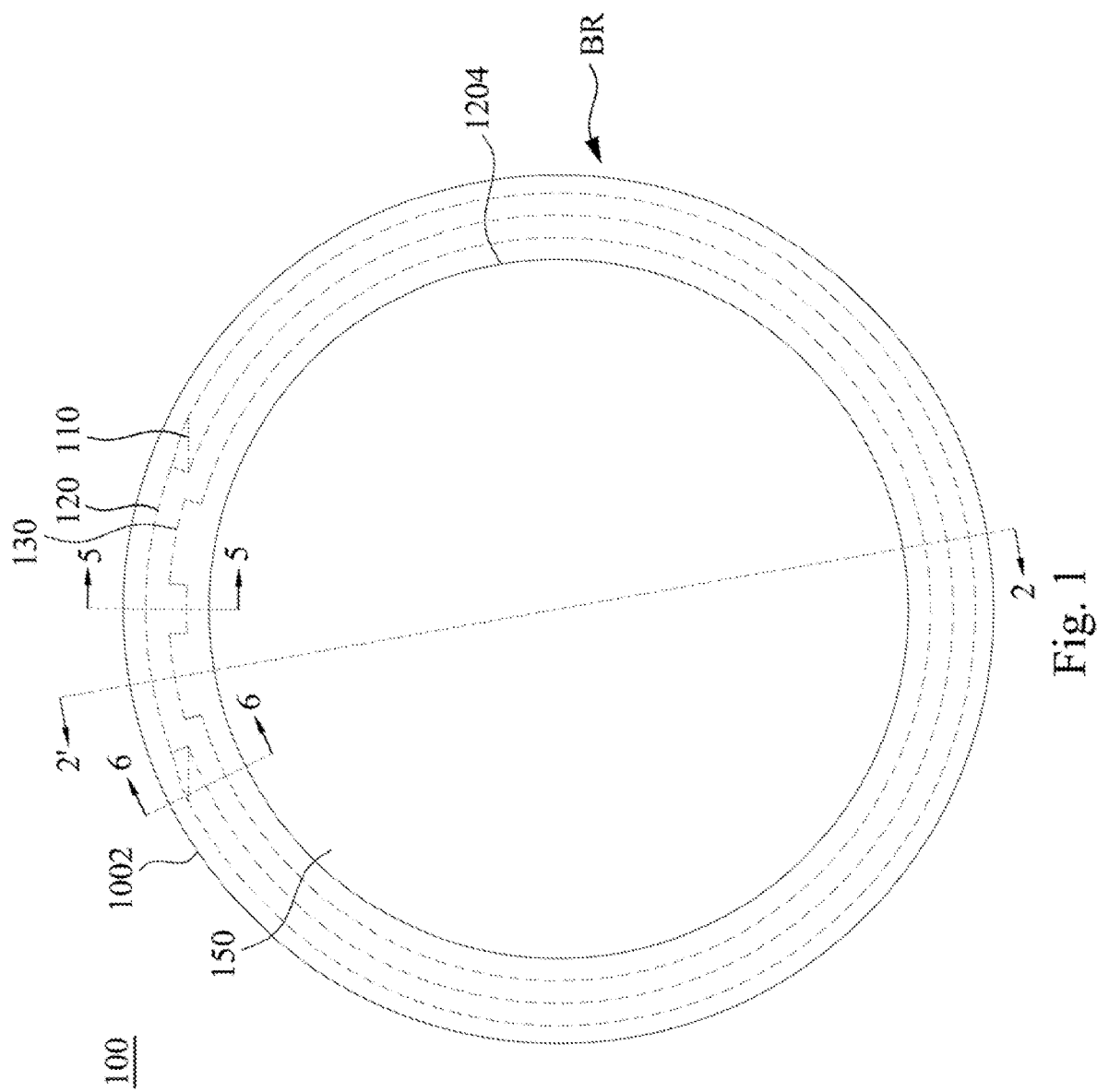
FIG. 1 is a top view of a narrow border reflective display device according to one embodiment of the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and components are schematically depicted in order to simplify the drawings. In the drawings, the thickness of layers and areas may be exaggerated for clarity. Wherever possible, the same reference numbers are used in the drawings and the description to refer to the same or like parts.

Figure 2:
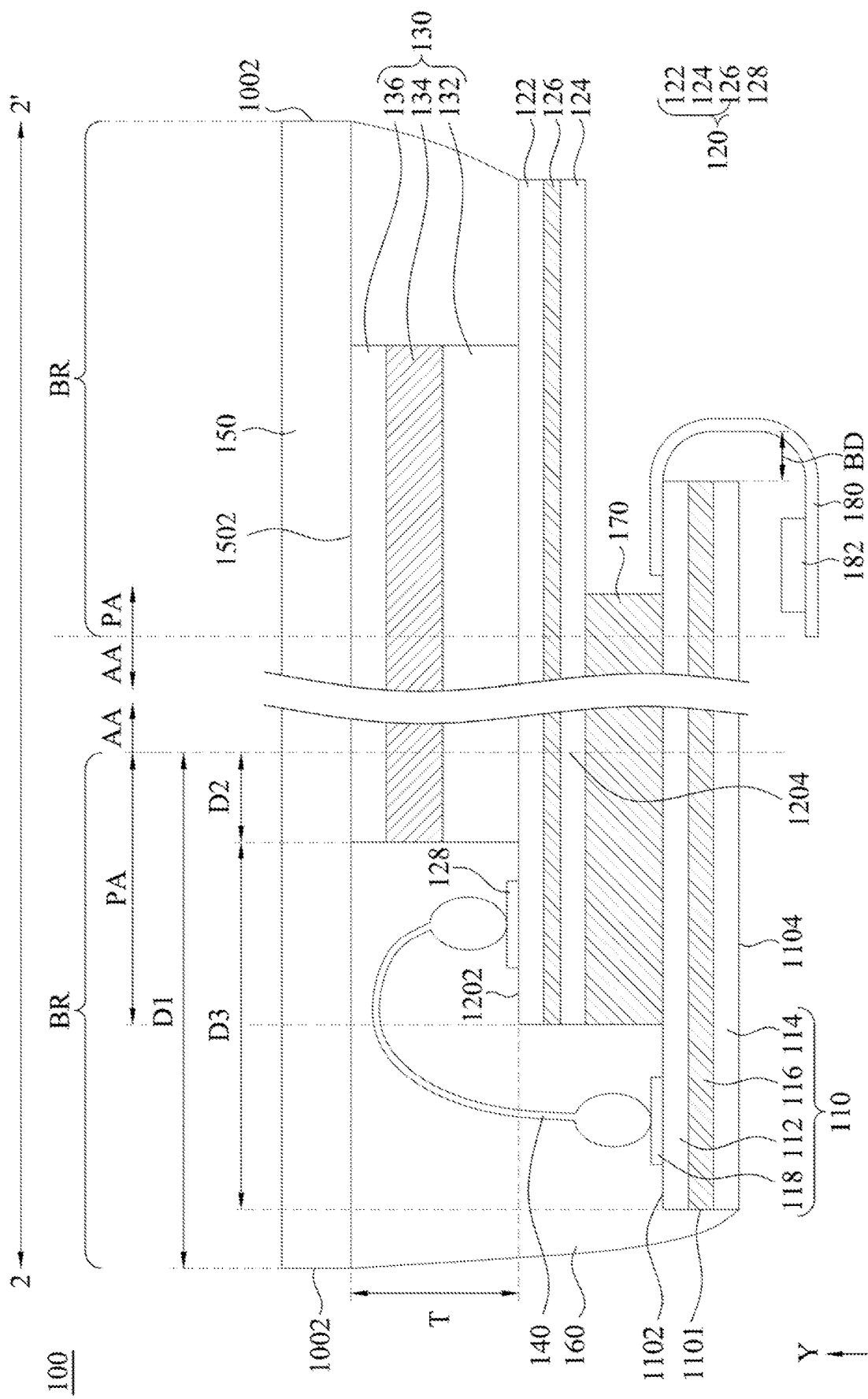
FIG. 2 is a cross-sectional view taken along line 2-2 in FIG. 1.

FIG. 1 is a top view of a narrow border reflective display device 100 according to one embodiment of the present disclosure. FIG. 2 is a cross-sectional view taken along line 2-2' in FIG. 1. Reference is made to FIG. 1 and FIG. 2. A border area BR on a left side of FIG. 2 is an illustration of an electrical connection area with conductive wires 140, and the border area BR on a right side of FIG. 2 is an illustration of a bonding area of a flexible printed circuit board 180. The narrow border reflective display device 100 includes a driving circuit substrate 110, a TFT substrate 120, a front panel laminate (FPL) 130, the conductive wires 140, a cover 150, and a glue 160. The TFT substrate 120 is located on the driving circuit substrate 110. The front panel laminate 130 is located on the TFT substrate 120. The TFT substrate 120 is located between the driving circuit substrate 110 and the front panel laminate 130. The conductive wires 140 are electrically connected with the driving circuit substrate 110 and the TFT substrate 120. The cover 150 is located on the front panel laminate 130. The glue 160 surrounds the driving circuit substrate 110, the TFT substrate 120, the front panel laminate 130, and the conductive wires 140, and the glue 160 is located between the cover 150 and the driving circuit substrate 110 and between the cover 150 and the TFT substrate 120. The glue 160 surrounds and covers a side surface 1101 of the driving circuit substrate 110.

Reference is made to FIG. 1 and FIG. 2. An area of the cover 150 is larger than an area of the driving circuit substrate 110. The cover 150 has an edge 1002, and the edge 1002 of the cover 150 is an edge of the narrow border reflective display device 100. That is to say, the area of the cover 150 is also larger than an area of the TFT substrate 120 and an area of the front panel laminate 130.

Reference is made to FIG. 2. The cover 150 has a first surface 1052 facing the driving circuit substrate 110. A vertical projection of the driving circuit substrate 110 on a first surface 1502 is located within a range of the first surface 1502. A vertical projection of the TFT substrate 120 and the front panel laminate 130 on the first surface 1502 is located within the range of the first surface 1502. In other words, the driving circuit substrate 110, the TFT substrate 120, the front panel laminate 130, the conductive wires 140, and the glue 160 entirely overlap the cover 150 in a vertical direction Y.

Reference is made to FIG. 2. The narrow border reflective display device 100 further includes an adhesive layer 170 located between the driving circuit substrate 110 and the TFT substrate 120. The adhesive layer 170 is a double-sided tape configured to adhere the driving circuit substrate 110 and the TFT substrate 120. A material of the adhesive layer 170 may be an organic material or an inorganic material.

Reference is made to FIG. 2. In the present embodiment, the narrow border reflective display device 100 is a flexible reflective display device. The driving circuit substrate 110 and the TFT substrate 120 have flexibility. The driving circuit substrate 110 includes a polyimide film 112, a protective layer 114, and an adhesive layer 116. The adhesive layer 116 is located between the protective layer 114 and the polyimide film 112. The adhesive layer 116 is configured to adhere the protective layer 114 and the polyimide film 112. For example, the narrow border reflective display device 100 is a watch, and the driving circuit substrate 110 integrates system components applied to the watch, such as a motor, a battery, and the like, in it.

The TFT substrate 120 includes a polyimide film 122, a protective layer 124, and an adhesive layer 126. The adhesive layer 126 is located between the protective layer 124 and the polyimide film 122. The adhesive layer 126 is configured to adhere the protective layer 124 and the polyimide film 122. The TFT substrate 120 further includes structures (not shown), such as gates, drains/sources, an insulating layer, and pixel electrodes, etc., formed on the polyimide film 122.

The front panel laminate 130 includes a display medium layer 132, a transparent conductive film 134, and an optical adhesive layer 136. The transparent conductive film 134 is located between the display medium layer 132 and the optical adhesive layer 136. The display medium layer 132 is, for example, an electronic ink layer.

The protective layer 114 of the driving circuit substrate 110 and the protective layer 124 of the TFT substrate 120 are configured to provide supporting forces for the polyimide film 112 and the polyimide film 122. A material of the protective layers 114, 124 may include stainless steel, titanium alloy, ceramic material, or glass, etc. However, the present disclosure is not limited in this regard. The protective layers 114, 124 have flexibility, and a hardness of the protective layers 114, 124 is greater than or equal to that of glass. For example, each of the protective layers 114, 124 may be glass with a thickness of about 0.1 millimeters (mm). The adhesive layer 116 of the driving circuit substrate 110 and the adhesive layer 126 of the TFT substrate 120 are double-sided tapes. A material of the adhesive layers 116, 126 may be an inorganic material or an organic material.

Figure 3:
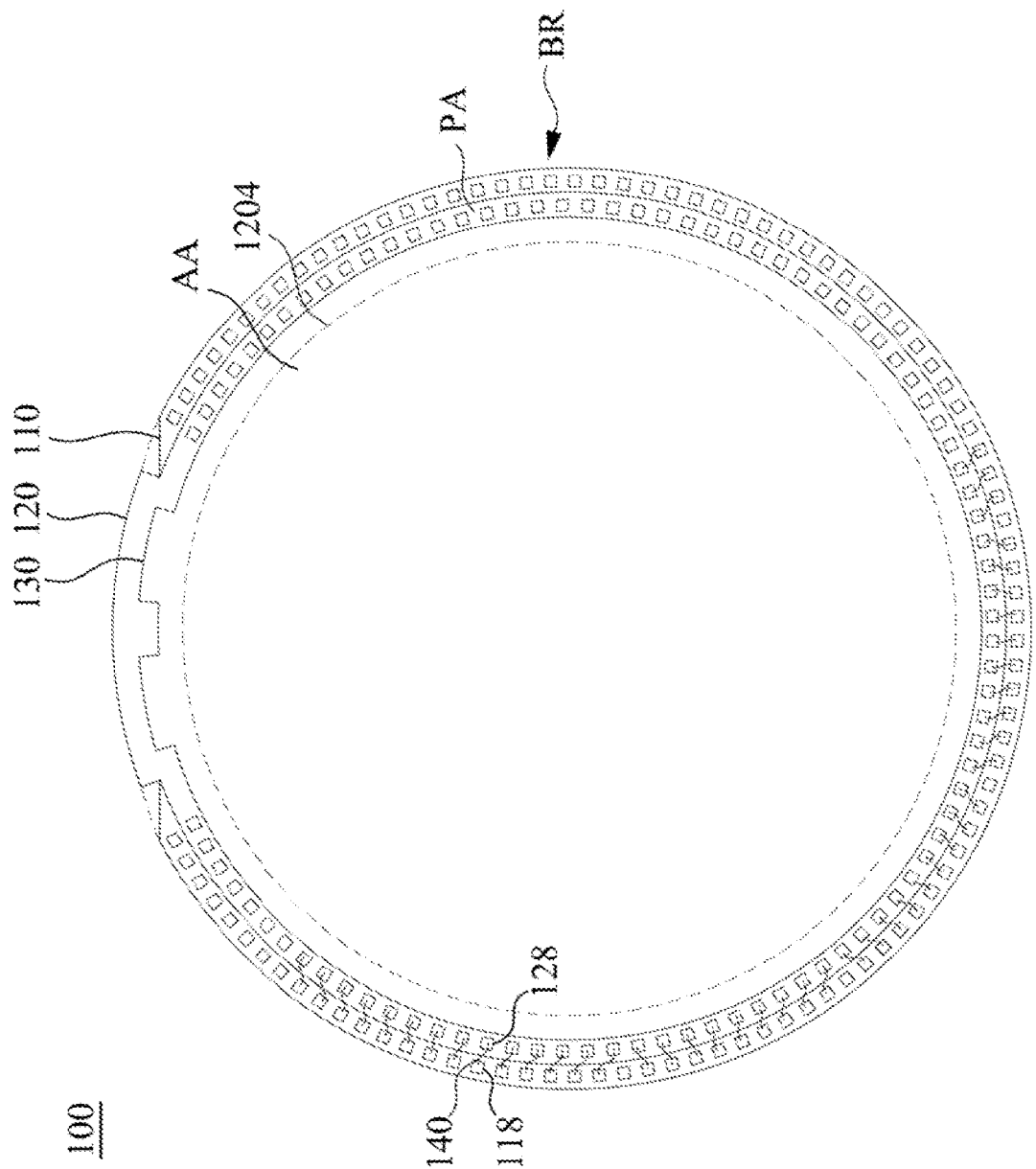
FIG. 3 is a top view of the narrow border reflective display device in FIG. 1 after omitting a cover and a glue.

FIG. 3 is a top view of the narrow border reflective display device 100 in FIG. 1 after omitting the cover 150 and the glue 160. Reference is made to FIG. 2 and FIG. 3. The TFT substrate 120 has a display area AA and a peripheral area PA surrounding the display area AA. The TFT substrate 120 has a boundary 1204 between the display area AA and the peripheral area PA. The area of the driving circuit substrate 110 is larger than an area of the TFT substrate 120, and the area of the TFT substrate 120 is larger than an area of the front panel laminate 130. As shown in FIG. 1 and FIG. 2, a range from a vertical projection of the boundary 1204 on the cover 150 to the edge 1002 of the cover 150 is the border area BR of the narrow border reflective display device 100.

Reference is made to FIG. 2 and FIG. 3. The driving circuit substrate 110 further includes multiple first conductive pads 118. The TFT substrate 120 further includes multiple second conductive pads 128. The conductive wires 140 are electrically connected with the first conductive pads 118 and the second conductive pads 128, respectively. The driving circuit substrate 110 has a second surface 1102 facing the TFT substrate 120. The first conductive pads 118 are located on the second surface 1102. A vertical projection of the TFT substrate 120 on the driving circuit substrate 110 does not overlap the first conductive pads 118. The first conductive pads 118 surround the TFT substrate 120. The TFT substrate 120 has a third surface 1202 facing the front panel laminate 130. The second conductive pads 128 are located on the third surface 1202. A vertical projection of the front panel laminate 130 on the TFT substrate 120 does not overlap the second conductive pads 128. The second conductive pads 128 surround the front panel laminate 130.

Reference is made to FIG. 2. The narrow border reflective display device 100 further includes the flexible printed circuit board 180 and a chip 182. The flexible printed circuit board 180 is bonded to the second surface 1102 of the driving circuit substrate 110, and the chip 182 is bonded to the flexible printed circuit board 180. The TFT substrate 120 is electrically connected with the chip 182 through the conductive wires 140 and the flexible printed circuit board 180 to drive the narrow border reflective display device 100.

The flexible printed circuit board 180 is bent under the driving circuit substrate 110. A vertical projection of the flexible printed circuit board 180 and the chip 182 on the first surface 1502 of the cover 150 is located within the range of the first surface 1502. In other words, the flexible printed circuit board 180 does not protrude from the edge 1002 of the cover 150.

In addition, a bending area BD of the flexible printed circuit board 180 is located below the TFT substrate 120, and a vertical projection of the flexible printed circuit board 180 on the TFT substrate 120 overlaps the peripheral area PA. Hence, the bending area BD of the flexible printed circuit board 180 does not occupy a space outside the TFT substrate 120. Additionally, there is no need to dispose an obviously protruding bonding area on the third surface 1202 of the TFT substrate 120 for bonding the flexible printed circuit board 180 by using the above design. As a result, the above configuration can shrink a width of the peripheral area PA of the TFT substrate 120.

In some embodiments, a vertical projection of part of the flexible printed circuit board 180 on the TFT substrate 120 may overlap the display area AA. Since the driving circuit substrate 110 is located below the TFT substrate 120, the design of the flexible printed circuit board 180 does not affect the display effect of the display area AA.

In FIG. 3, only a part of the conductive wires 140 are illustrated as an example. Sizes and spacings of the first conductive pads 118 and the second conductive pads 128 are not limited to those shown in FIG. 3. In some embodiments, dummy conductive pads may be disposed, and the dummy conductive pads are not electrically connected with the conductive wires.

In the present embodiment, the first conductive pads 118 and the second conductive pads 128 are evenly distributed in the border area BR of the narrow border reflective display device 100. In other words, the first conductive pads 118 and the second conductive pads 128 surround the display area AA. As shown in FIG. 3, a distribution range of the first conductive pads 118 is approximately annular (such as 330 degrees) in the present embodiment. A disposition position of the flexible printed circuit board 180 is on an upper surface of the narrow border reflective display device 100, but the present disclosure is not limited thereto. For example, in other embodiments the distribution range of the first conductive pads 118 is smaller (such as 180 degrees), and then the disposition position of the flexible printed circuit board 180 can be located at any position without the first conductive pads 118.

As can be understood from the above, by stacking the TFT substrate 120 and the driving circuit substrate 110 and by using the conductive wires 140 to electrically connect the first conductive pads 118 and the second conductive pads 128 distributed in the border area BR, the flexible printed circuit board 180 does not need to be bonded to the TFT substrate 120. In other words, merely a distance between the first conductive pad 118 and the second conductive pad 128 is needed for consideration when determining the width of the border area BR. As a result, a width of the border area BR of the narrow border reflective display device 100 can be shrunk. Take the embodiment shown in FIG. 1 as an example, a distance D1 from the boundary 1204 to the edge 1002 of the cover 150 in a radial direction is smaller than 2.5 mm, that is to say, the width of the border area BR of the narrow border reflective display device 100 is smaller than 2.5 mm. In other words, with the above configuration, the narrow border reflective display device 100 of the present disclosure can have a narrow border.

Reference is made to FIG. 2. In the present embodiment, a thickness T between the first surface 1502 of the cover 150 and the third surface 1202 of the TFT substrate 120 is less than about 0.255 mm. A distance D2 from the boundary 1204 to a sidewall of the front panel laminate 130 is about 0.5 mm. A distance D3 from the sidewall of the front panel laminate 130 to a sidewall of the driving circuit substrate 110 is about 1.8 mm.

Figure 4:
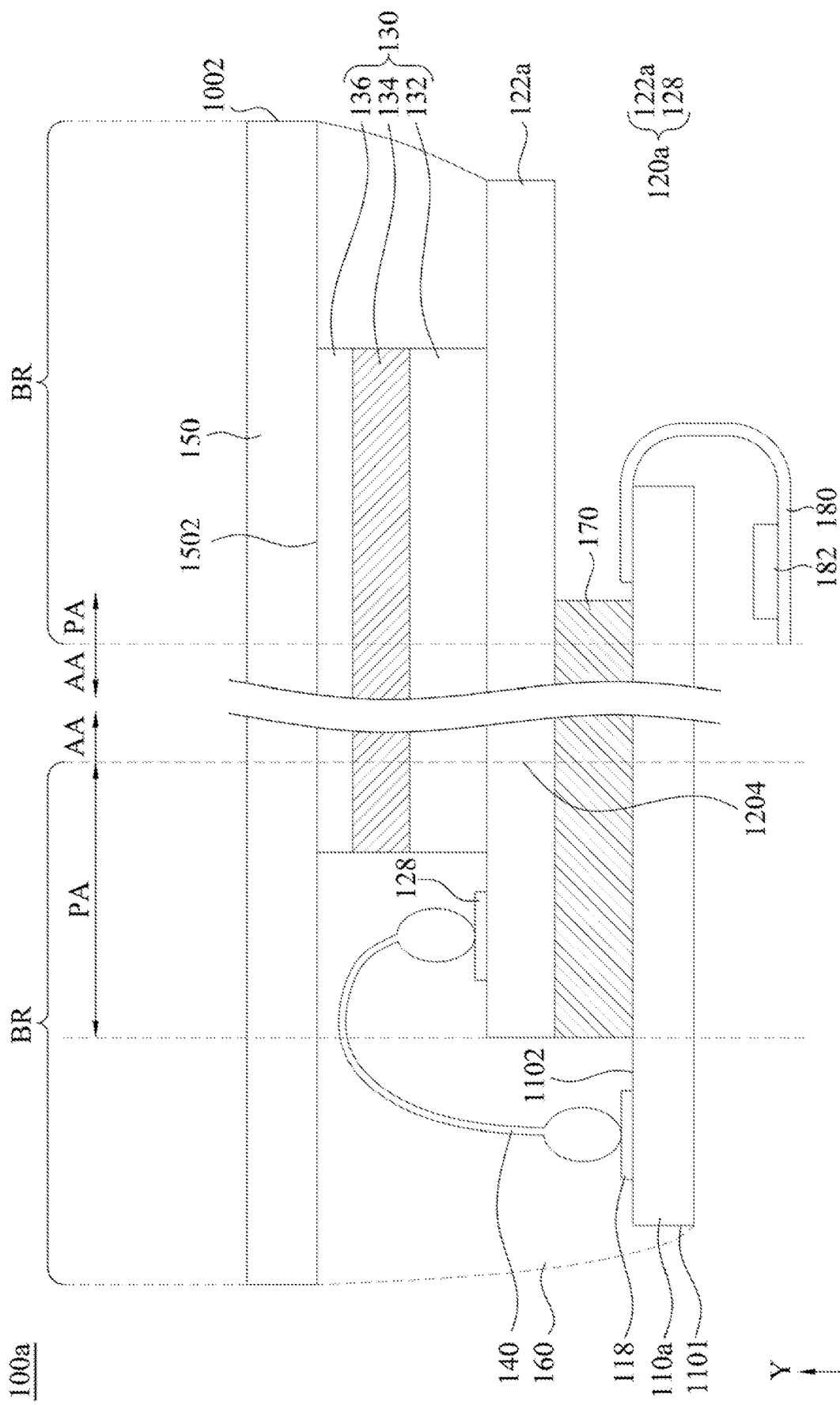
FIG. 4 is a cross-sectional view of a narrow border reflective display device according to another embodiment of the present disclosure.

FIG. 4 is a cross-sectional view of a narrow border reflective display device 100a according to another embodiment of the present disclosure. The cross-sectional position in FIG. 4 is the same as that shown in FIG. 2. The narrow border reflective display device 100a is substantially the same as the narrow border reflective display device 100, and the difference is that the narrow border reflective display device 100a is an inflexible display device. A TFT substrate 120a has a substrate 122a. Materials of a driving circuit substrate 110a and the substrate 122a of the TFT substrate 120a are glasses. For example, a thickness of the glasses is about 0.5 mm to 0.7 mm. The above structural dimension is merely demonstrated as an example and is not intended to limit the present disclosure.

Since the narrow border reflective display device 100a and the narrow border reflective display device 100 have the same technical advantages, a description is not repeated hereinafter.

Figure 5:
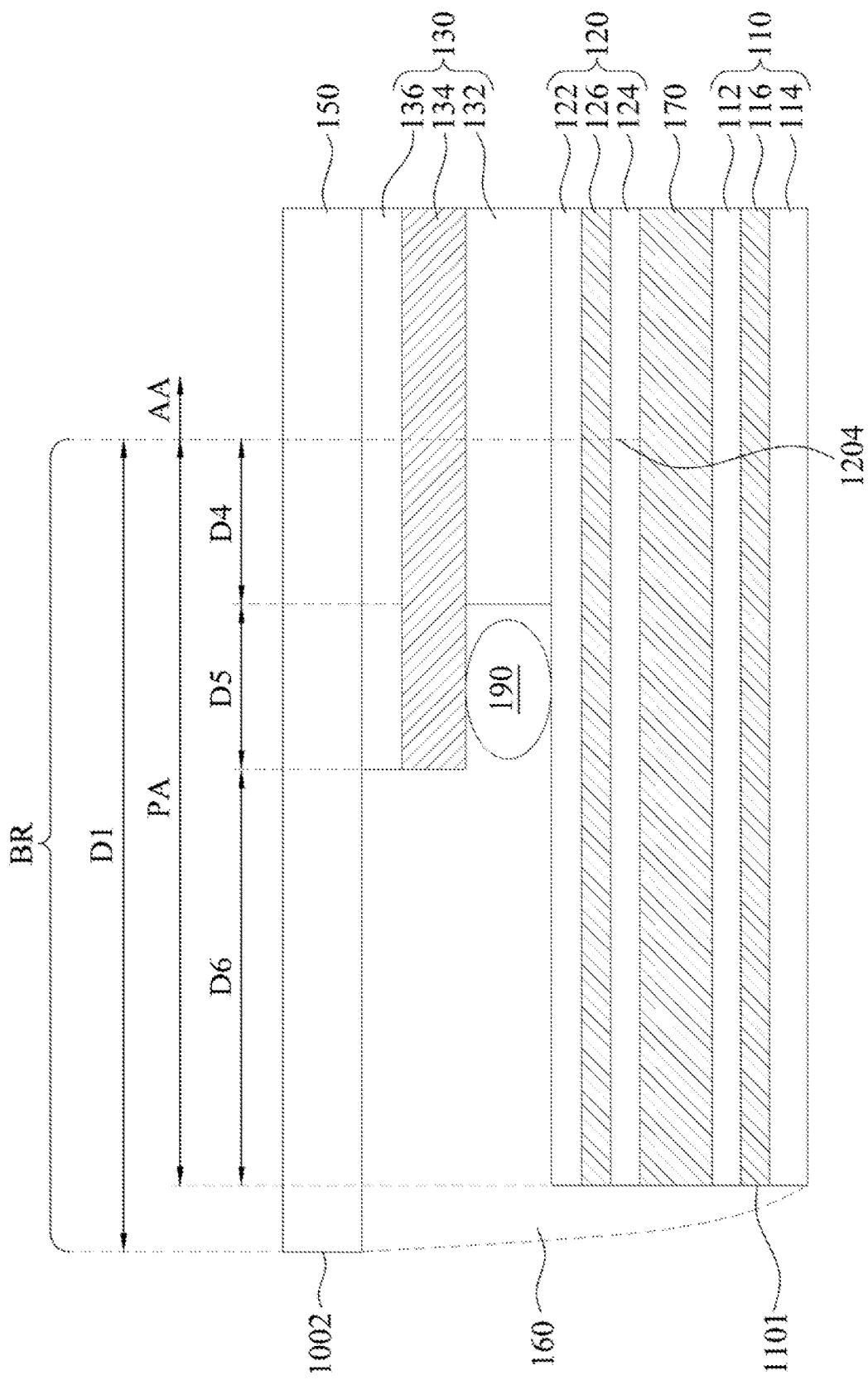
FIG. 5 is a cross-sectional view taken along line 5-5 in FIG. 1.

FIG. 5 is a cross-sectional view taken along line 5-5 in FIG. 1. The narrow border reflective display device 100 does not have the first conductive pads 118, the second conductive pads 128, and the conductive wires 140 at the position shown in FIG. 5. In this area, the narrow border reflective display device 100 includes a silver paste 190 disposed between the display medium layer 132 and the glue 160. The silver paste 190 is configured to electrically connect the transparent conductive film 134 and pins on the TFT substrate 120.

A distance D4 from the boundary 1204 to a sidewall of the display medium layer 132 is about 0.6 mm. A distance D5 from the sidewall of the front panel laminate 130 to the sidewall of the display medium layer 132 is about 0.7 mm. A distance D6 from the sidewall of the front panel laminate 130 to the sidewall of the driving circuit substrate 110 is about 1.0 mm. The above structural dimension is merely demonstrated as an example and is not intended to limit the present disclosure.

Figure 6:
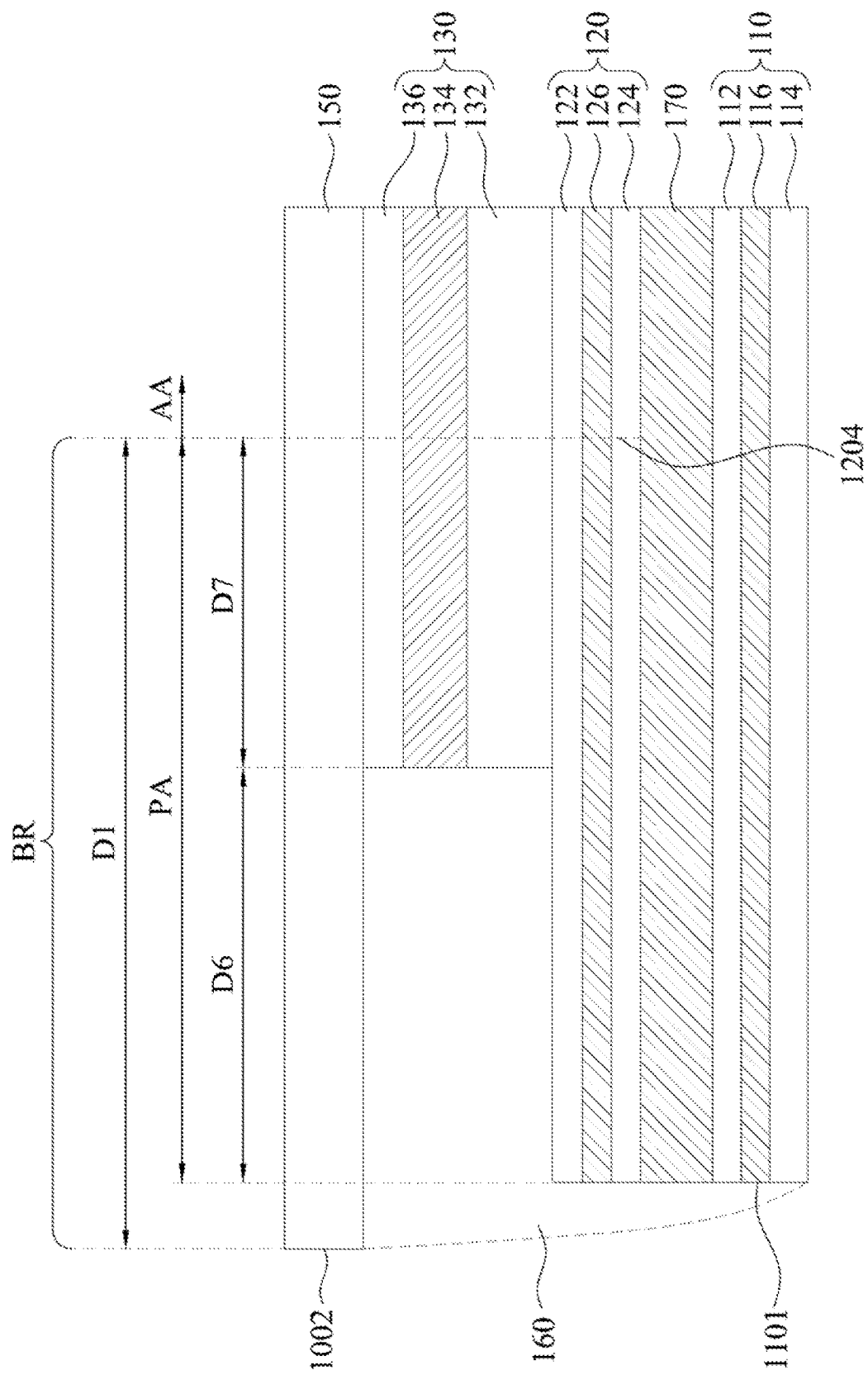
FIG. 6 is a cross-sectional view taken along line 6-6 in FIG. 1.
Figure 7:
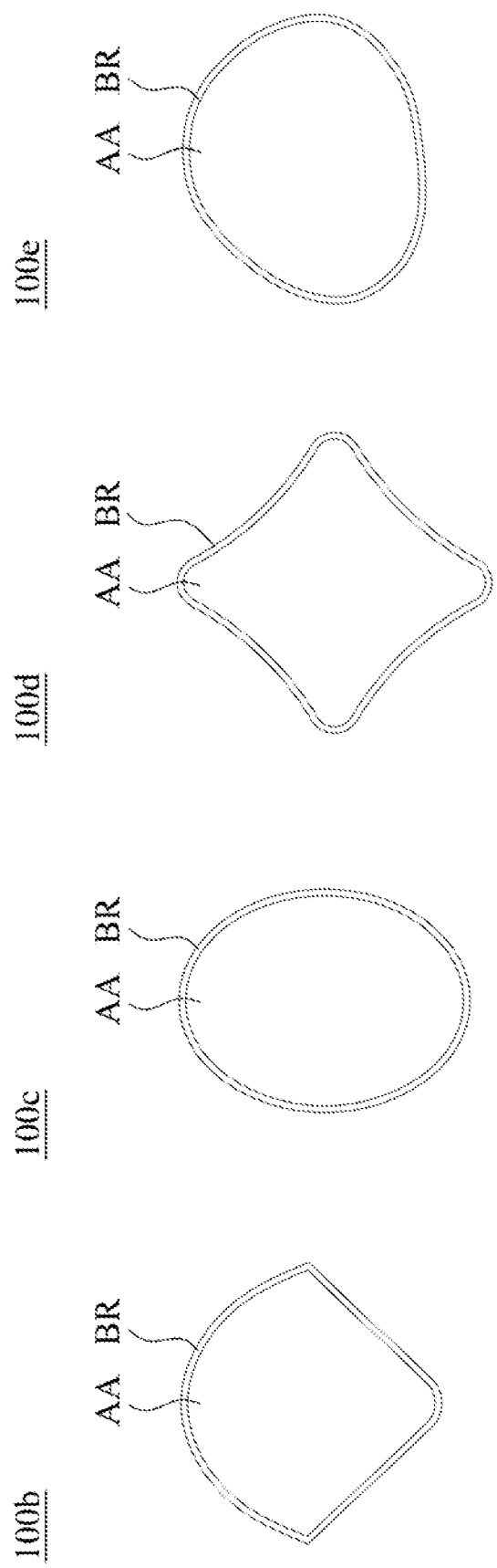
FIG. 7A to FIG. 7D are top views of narrow border reflective display devices according to some embodiments of the present disclosure.

FIG. 6 is a cross-sectional view taken along line 6-6 in FIG. 1. The narrow border reflective display device 100 does not have the first conductive pads 118, the second conductive pads 128, and the conductive wires 140 at the position shown in FIG. 6. In this area, a distance D7 from the boundary 1204 to the sidewall of the front panel laminate 130 is about 1.3 mm. The distance D6 from the sidewall of the front panel laminate 130 to the sidewall of the driving circuit substrate 110 is about 1.0 mm. The above structural dimensions only serve as an example and are not intended to limit the present disclosure.

As can be understood from the above structural dimensions shown in FIG. 2, FIG. 5 and FIG. 6, the distances D1 from the boundary 1204 to the edge 1002 can all be reduced to be less than 2.5 mm according to the structural configurations of different areas. In addition to that, a shape of the border area BR may be determined depending on a shape of the display area AA. As can be understood from the above, the narrow border reflective display device of the present disclosure can have a customized shape and have the border area BR less than 2.5 mm.

FIG. 7A to FIG. 7D are top views of narrow border reflective display devices according to some embodiments of the present disclosure. FIG. 7A to FIG. 7D are top views of narrow border reflective display devices 100b, 100c, 100d, and 100e, respectively. As shown in the figures, display areas AA of the narrow border reflective display devices 100b, 100c, 100d, and 100e may have any shape, and border areas BR may be determined depending on the shapes of the display areas AA.

Figure 8:
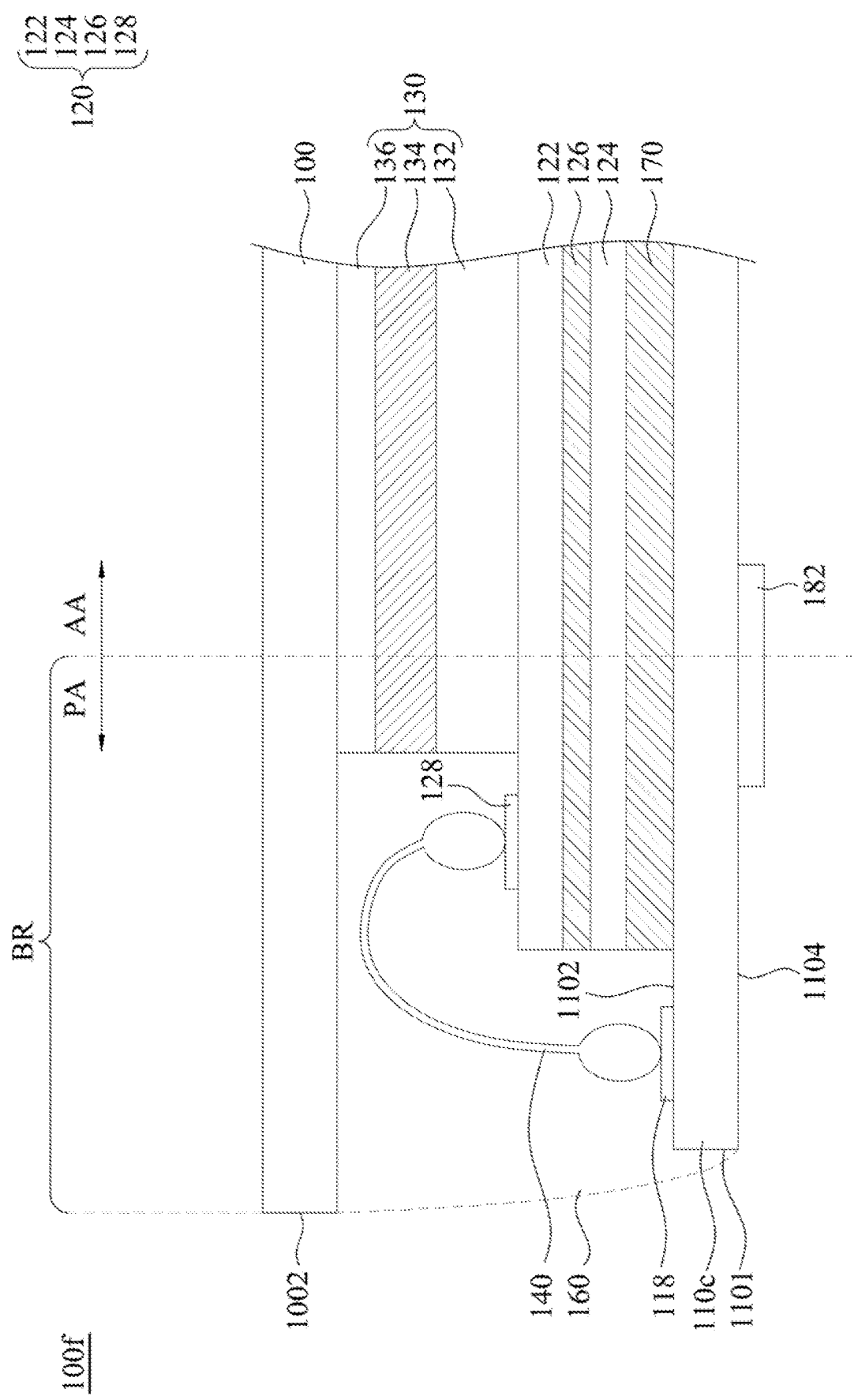
FIG. 8 is a cross-sectional view of a narrow border reflective display device according to still another embodiment of the present disclosure.

FIG. 8 is a cross-sectional view of a narrow border reflective display device 100f according to another embodiment of the present disclosure. The narrow border reflective display device 100f has the same cross-sectional position as the narrow border reflective display device 100 shown in FIG. 2. The border area BR on the right side is omitted in FIG. 8. The narrow border reflective display device 100f is substantially the same as the narrow border reflective display device 100, and the difference is that a driving circuit substrate 110c of the narrow border reflective display device 100f is a printed circuit board (PCB) or a flexible printed circuit board. The driving circuit substrate 100c has a fourth surface 1104 facing away from the TFT substrate 120. In the present embodiment, the chip 182 of the narrow border reflective display device 100f is bonded to the fourth surface 1104 of the driving circuit substrate 110c. A vertical projection of the chip 182 on the TFT substrate 120 may overlap the display area AA and/or the peripheral area PA, which does not affect the display effect of the display area AA. In other words, the narrow border reflective display device 100f is equivalent to integrating the driving circuit substrate 110 and the flexible printed circuit board 180 in the narrow border reflective display device 100 into the driving circuit substrate 110c. With such design, the narrow border reflective display device 100f can be made lighter and thinner. In addition, a chip on film (COF) process can be omitted in such design, which makes the process of the narrow border reflective display device 100f briefer. Since the narrow border reflective display device 100f and the narrow border reflective display device 100 have the same technical advantages, and a description is not repeated hereinafter. In another embodiment of the present disclosure, the chip 182 may be bonded to the second surface 1102 of the driving circuit substrate 110c.

Figure 9:
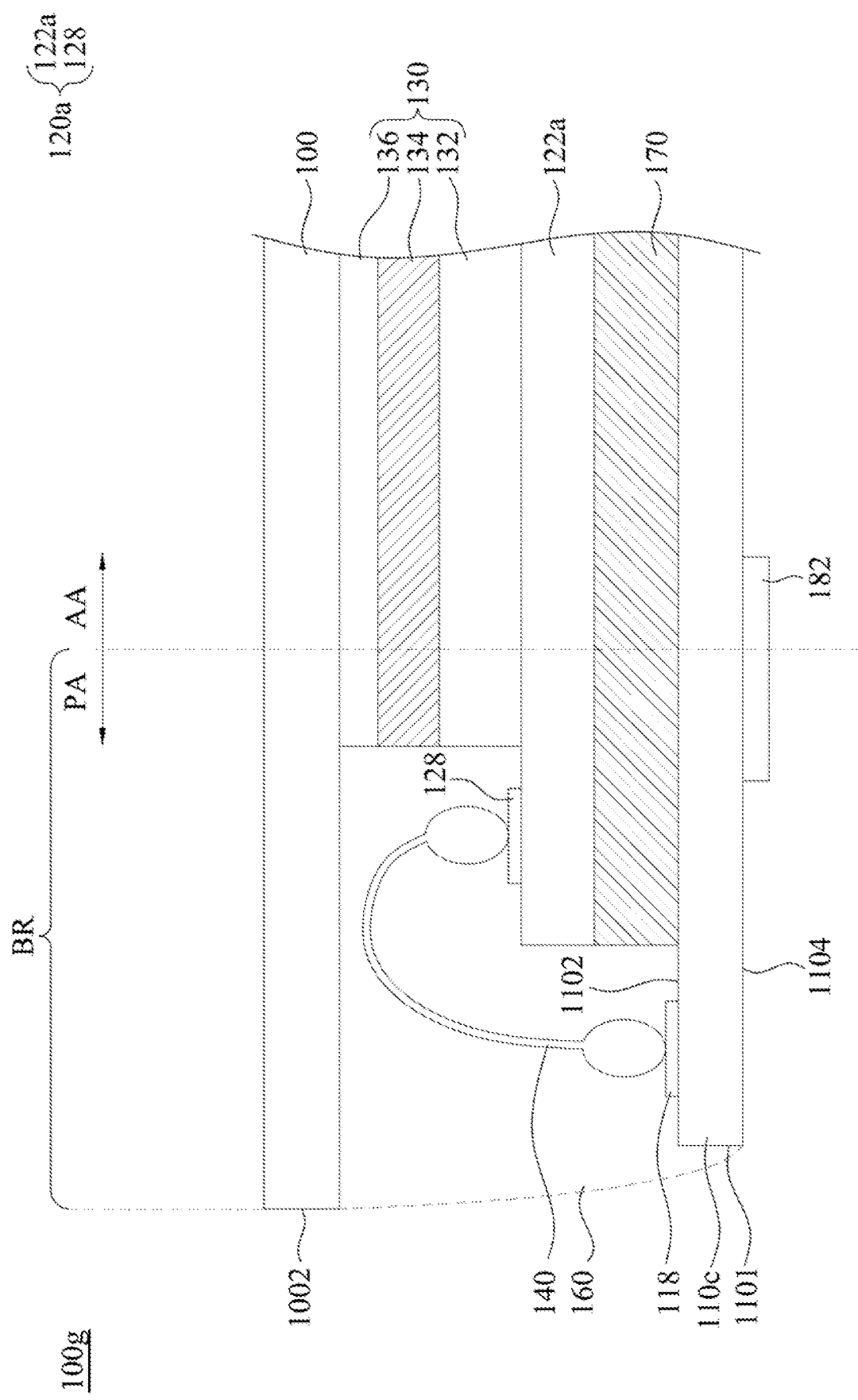
FIG. 9 is a cross-sectional view of a narrow border reflective display device according to yet another embodiment of the present disclosure.

FIG. 9 is a cross-sectional view of a narrow border reflective display device 100g according to another embodiment of the present disclosure. The narrow border reflective display device 100g has the same cross-sectional position as the narrow border reflective display device 100 shown in FIG. 2. The border area BR on the right side is omitted in FIG. 9. The narrow border reflective display device 100g is substantially the same as the narrow border reflective display device 100f, and the difference is that the narrow border reflective display device 100g is an inflexible display device. In other words, the TFT substrate 120a of the narrow border reflective display device 100g has the substrate 122a, and the material of the substrate 122a is glass. Since the narrow border reflective display device 100g and the narrow border reflective display device 100f have the same technical advantages, a description is not repeated hereinafter.

In summary, the TFT substrate is electrically connected with the chip through the conductive wires and the flexible printed circuit board to drive the narrow border reflective display device. Hence, there is no need to dispose an obviously protruding bonding area on the TFT substrate for bonding the flexible printed circuit board. The aforementioned configuration can shrink the width of the peripheral area of the TFT substrate. According to the present disclosure, by stacking the TFT substrate and the driving circuit substrate and by using the conductive wires to electrically connect the first conductive pads and the second conductive pads distributed in the border area, the flexible printed circuit board does not need to be bonded to the TFT substrate. In other words, merely a distance between the first conductive pad and the second conductive pad is needed for consideration when determining the width of the border area. As a result, the width of the border area of the narrow border reflective display device can be shrunk. Additionally, the shape of the border area can be determined depending on the shape of the display area, so that the narrow border reflective display device can have a customized shape.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A narrow border reflective display device comprising:
   a driving circuit substrate;
   a TFT substrate located on the driving circuit substrate;
   a front panel laminate comprising a display medium layer, wherein the TFT substrate is located between the driving circuit substrate and the front panel laminate, and the display medium layer is an electronic ink layer;
   a plurality of conductive wires electrically connected with the driving circuit substrate and the TFT substrate, wherein the conductive wires are curved, wherein two ends of each of the conductive wires are located on different surfaces;
   a cover located on the front panel laminate and comprises a first surface facing the driving circuit substrate, and a vertical projection of the driving circuit substrate onto the first surface is located within a range of the first surface;
   a glue surrounding the driving circuit substrate, the TFT substrate, the front panel laminate, and the conductive wires; and
   a flexible printed circuit board and a chip, wherein the driving circuit substrate has a second surface facing the TFT substrate, a first end of the flexible printed circuit board is bonded to the second surface of the driving circuit substrate through a third surface, a second end of the flexible printed circuit board is free from connecting with the TFT substrate, and the chip is bonded to the third surface of the flexible printed circuit board.

2. The narrow border reflective display device of claim 1, wherein the TFT substrate comprises a display area and a peripheral area surrounding the display area, the TFT substrate has a boundary between the display area and the peripheral area, and the cover has an edge, wherein in a top view a distance from a vertical projection of the boundary of the TFT substrate onto the cover to the edge of the cover is smaller than 2.5 mm.

3. The narrow border reflective display device of claim 1, wherein the driving circuit substrate further comprises a plurality of first conductive pads, the TFT substrate further comprises a plurality of second conductive pads, and the conductive wires are electrically connected with the first conductive pads and the second conductive pads, respectively.

4. The narrow border reflective display device of claim 3, wherein the first conductive pads are located on the second surface, and the first conductive pads surround the TFT substrate.

5. The narrow border reflective display device of claim 4, wherein the TFT substrate has a fourth surface facing the front panel laminate, the second conductive pads are located on the fourth surface, and the second conductive pads surround the front panel laminate.

6. The narrow border reflective display device of claim 1, wherein the TFT substrate comprises a protective layer, a polyimide film, and an adhesive layer located between the protective layer and the polyimide film.

7. The narrow border reflective display device of claim 1, wherein a material of the TFT substrate comprises glass.

8. The narrow border reflective display device of claim 1, wherein the driving circuit substrate comprises a protective layer, a polyimide film, and an adhesive layer located between the protective layer and the polyimide film.

9. The narrow border reflective display device of claim 1, wherein a material of the driving circuit substrate comprises glass.

10. The narrow border reflective display device of claim 1, wherein in a top view a vertical projection of the flexible printed circuit board and the chip onto the first surface of the cover is located within a range of the first surface.

11. The narrow border reflective display device of claim 1, wherein the driving circuit substrate has a fifth surface facing away from the TFT substrate, the driving circuit substrate is a printed circuit board or a flexible printed circuit board, and the narrow border reflective display device further comprises a chip bonded to the fifth surface of the driving circuit substrate.

12. The narrow border reflective display device of claim 1, wherein the glue surrounds and covers a side surface of the driving circuit substrate.

13. A narrow border reflective display device comprising:
    a driving circuit substrate;
    a TFT substrate located on the driving circuit substrate;
    a front panel laminate comprising a display medium layer, wherein the TFT substrate is located between the driving circuit substrate and the front panel laminate, and the display medium layer is an electronic ink layer;
    a plurality of conductive wires electrically connected with the driving circuit substrate and the TFT substrate, wherein the conductive wires are curved, wherein two ends of each of the conductive wires are located on different surfaces;
    a cover located on the front panel laminate and comprises a first surface facing the driving circuit substrate, and a vertical projection of the driving circuit substrate onto the first surface is located within a range of the first surface;
    a glue located between the cover and the driving circuit substrate and between the cover and the TFT substrate, wherein the driving circuit substrate, the TFT substrate, the front panel laminate, the conductive wires, and the glue entirely overlap the cover in a vertical direction; and
    a flexible printed circuit board and a chip, wherein the driving circuit substrate has a second surface facing the TFT substrate, a first end of the flexible printed circuit board is bonded to the second surface of the driving circuit substrate through a third surface, a second end of the flexible printed circuit board is free from connecting with the TFT substrate, and the chip is bonded to the flexible printed circuit board.

14. The narrow border reflective display device of claim 13, wherein the glue surrounds and covers a side surface of the driving circuit substrate.

15. The narrow border reflective display device of claim 13, wherein the TFT substrate comprises a display area and a peripheral area surrounding the display area, the TFT substrate has a boundary between the display area and the peripheral area, and the cover has an edge, wherein in a top view a distance from a vertical projection of the boundary of the TFT substrate onto the cover to the edge of the cover is smaller than 2.5 mm.

* * * * *